United States Patent [19]
Priebe et al.

[11] Patent Number: 5,565,764
[45] Date of Patent: Oct. 15, 1996

[54] DIGITAL PROCESSING METHOD FOR PARAMETER ESTIMATION OF SYNCHRONOUS, ASYNCHRONOUS, COHERENT OR NON-COHERENT SIGNALS

[75] Inventors: Leslie A. Priebe, Plano; Michael C. Stephens, Lucas; William D. Daniels, Richardson, all of Tex.

[73] Assignee: Texas Instruments Incorporated, Dallas, Tex.

[21] Appl. No.: 435,685

[22] Filed: May 5, 1995

[51] Int. Cl.$^6$ .................................................... G01R 23/16
[52] U.S. Cl. ........................................ 324/76.21; 364/604
[58] Field of Search ........................... 324/76.21, 76.22, 324/76.14, 76.24, 76.33, 76.57, 76.35, 76.29, 76.12, 76.28, 76.47, 76.55, 84, 334–337; 364/604; 375/244

[56] References Cited

U.S. PATENT DOCUMENTS

| | | | |
|---|---|---|---|
| 3,586,843 | 6/1971 | Sloane | 324/76.21 |
| 4,489,280 | 12/1984 | Bennett, Jr. et al. | 327/46 |
| 4,506,225 | 3/1985 | Loveless et al. | 324/334 |
| 5,063,574 | 11/1991 | Moose | 375/244 |

*Primary Examiner*—Michael Tokar
*Attorney, Agent, or Firm*—René E. Grossman; Richard L. Donaldson

[57] ABSTRACT

The parameters of a digital signal are extracted by the application of autocorrelation and crosscorrelation techniques to effectively measure the frequency and time behavior of a digital signal. The method employs digital autocorrelation and crosscorrelation to determine these parameters. Autocorrelation allows the measurement of signal frequency by measurement of instantaneous signal phase. Crosscorrelation allows measurement of relative phase between two or more signals in two or more channels by measurement of instantaneous phase and by referencing the instantaneous phase to the autocorrelation function. The autocorrelation function and crosscorrelation function preserve relative amplitude and phase. Measurement of relative amplitude and phase allows direction finding calculation for any current class of system that uses amplitude and/or phase to derive angle or arrival. Signal time and frequency measurement at the output of a correlation receiver result in robust characterization of the parameters of the signal. Digital calculations are superior to current analog or hybrid analog and digital methods because errors due to component aging, drift and temperature effects are easily prevented.

24 Claims, 2 Drawing Sheets

Fig. 5a INPUT SIGNAL

Fig. 5c AUTOCORRELATION

Fig. 5b FOURIER TRANSFORM

Fig. 5d CROSSCORRELATION

DIGITAL PROCESSING METHOD FOR PARAMETER ESTIMATION OF SYNCHRONOUS, ASYNCHRONOUS, COHERENT OR NON-COHERENT SIGNALS

BACKGROUND OF THE INVENTION

1. Field of the Invention

This invention relates to the use of digital correlation receivers to measure the parameters of non-cooperative coherent or non-coherent emitters.

2. Brief Description of the Prior Art

Prior art approaches for measurement of relative phase, frequency and pulse repetition interval (PRI) for coherent emitters and the measurement of relative phase and frequency for a non-coherent emitter at the output of a correlation receiver use predominantly time domain techniques to characterize non-coherent, pulsed and asynchronous signals. Coherent processing in pulse doppler radar systems uses either time or frequency domain techniques to determine doppler shift with respect to a known frequency reference. Pulse compression in radar systems by both compressive and transform techniques achieves correlation with a known reference waveform. Compressive receivers and scanning receivers analyze the spectra of pulsed waveforms in receivers and spectrum analyzers. Fourier transform based receivers analyze frequency domain spectra. Correlation receivers in both time domain and frequency domain architectures measure time difference of arrival and differential doppler. Channelized receivers employ brute force frequency domain techniques to separate simultaneous signals by using a parallel bank of filters that provide frequency selectivity. If two signals are simultaneously present in a single channel, the channelizer may indicate the presence of multiple signals, but cannot measure truly simultaneous signals under all conditions of signal amplitude and relative time delay. An example of this is the presence of synchronized or nearly synchronized signals with harmonically related PRI values. For this condition, the channelizer will frequently fail to measure the parameters of either or both signals.

Instantaneous frequency measurement (IFM) receivers cannot measure the frequency of simultaneous signals. The IFM indicates the frequency of the largest signal in a simultaneous signal interception. An IFM receiver requires about 10 dB signal-to-noise (SNR) ratio at an intermediate frequency (IF) to properly indicate frequency.

Compressive receivers provide selectivity and multiple signal handling capability, but do not allow accurate measurements of PRI. These receivers permit estimation of pulse width at high SNR values, but have limited dynamic range and limited time resolution. Compressive receivers have a fixed time-bandwidth product for each design realization. This limits the performance of compressive receivers in environments that have a variety of signals. Compressive receivers lose sensitivity (SNR) when the signal does not completely fill the time aperture of the compressive receiver. Sensitivity loss is a function of duty cycle and can be calculated from the equation: $-20\star\log$ (duty), where (duty) is the fractional ratio of the time the signal is present to the time aperture of the receiver.

Correlation receivers estimate time difference of arrival for signal detection in analog and digital realizations in a variety of applications. These receivers do not measure angle of arrival, PRI, pulse width or frequency in the digital domain using the methods described in the present application. If multiple signals are present in the same time aperture, the previously reported correlation processes cannot measure the signal parameters. The near zero delay terms of the correlation output contain information related to all the signals present in the receiver time aperture.

The performance of a time domain receiver is severely limited in the presence of multiple signals and in high density environments. This is because time domain receivers use some form of IFM to measure frequency and multiple time overlapping signals interfere with each other due to non-linear interactions within the IFM limiter. Typically, only one signal is measured at a time and the measurement is incorrect if two or more signals are present.

Fourier transform based receivers suffer sensitivity loss $[-20\star\log(\text{duty})]$ for signals that do not fill the time aperture of the receiver. This results in unacceptable sensitivity for low duty cycle signals.

Scanning receivers used in spectrum analyzers and EW systems provide a low probability of signal intercept due to the narrow instantaneous bandwidth. Multiple scans must be used to characterize moderate to low duty cycle signals.

SUMMARY OF THE INVENTION

The procedures used in accordance with the present invention differ from those previously published in the methods for measurement of relative phase, frequency and pulse repetition interval (PRI) for coherent emitters and the measurement of relative phase and frequency for a non-coherent emitter at the output of a correlation receiver. These methods provide a robust signal estimation capability.

The preferred embodiment in accordance with the present invention differs from known prior art approaches in the methods for determining the signal characteristics such as angle of arrival, pulse repetition interval, pulse width and measurement of modulation on the pulse for coherent, non-coherent, synchronous and asynchronous waveforms. The method disclosed in this application, used as a processing method for each channel of a channelizer, improves the capability to separate and measure simultaneous signals within a single channel. The method herein yields significant improvements in channel sensitivity, signal selectivity and signal characterization compared to current techniques and provides improved capability to measure simultaneous signal parameters by providing multiple frequency detection and multiple signal correlation. Significant increases in sensitivity, selectivity and parameter measurement accuracy are obtained over current IFM techniques. The methods in accordance with the present invention are programmable to permit a multiplicity of time-bandwidth product capabilities. This allows interception and characterization of signals with widely varying time-bandwidth product. The correlation receiver is more sensitive than the compressive receiver since the correlation process integrates over both the duration (time) and signal bandwidth of the unknown signal. The correlation approach permits more analysis flexibility than compressive receivers since the parameters of the analysis, such as time aperture and sample rate, are programmable. The method permits improvement of correlation receiver operation in multiple signal environments by making measurements at non-zero delay values in the correlation domain. Both time and frequency behavior of a signal at the output of a correlation receiver are measured. If multiple signals exist in the receiver time aperture, presorting in the frequency domain or separation in the correlation domain allows signal parameter measurement. Presorting in the frequency domain based upon angle of arrival (AOA) allows separation of signals even in the extreme case of harmonically related PRI. Harmonically related PRI values cannot be measured by any other known correlation receivers. If the signals have non-harmonically related PRI, the signals will separate at various delay values in the correlation domain, but separation in angle provides a more robust signal separation. If very high signal densities exist, the short time transform permits robust separation of signals in time, frequency and AOA. The present invention provides significantly more robust and flexible multiple signal separation than the prior art approaches. The preferred embodiment herein permits measurement of multiple signals using frequency and angle presorting. The processing approach provides superior sensitivity for all signals of interest with fast processing analogous to time domain processing at readily achievable data rates. SNR improvement of correlation for both moderate and very low duty cycle signals that may be non-coherent or coherent is provided. The programmable approach provides superior sensitivity performance to existing receivers. The present invention employs a variable time-bandwidth product receiver to significantly improve the probability of intercept of low and moderate duty cycle signals. Rapidly stepping the receiver across large frequency regions allows interception of continuous wave (CW) or pulsed waveforms with very high sensitivity and high probability of intercept.

Briefly, the processing methods in accordance with the present invention use a correlation receiver to improve the capability of present systems to determine parameters such as angles of arrival (AOA), frequency, pulse width, amplitude and pulse repetition interval from a radio frequency (RF) signal incident on a receiver with an array of antenna elements. The approach measures a time sequence of amplitude and phase data from an array of antenna elements and performs coherent digital signal processing to increase signal detectability and to determine parameters such as angles of arrival, frequency, pulse width, amplitude and pulse repetition interval from single or multiple radiating sources. The invention uses both short time aperture and long time aperture correlation for various classes of waveforms to optimize parameter measurement with a programmable digital signal processor.

In accordance with the present invention, novel methods are used for amplitude and phase calculation at the output of a correlation receiver to estimate signal parameters. The method allows reduction of receiver cost and complexity by using common components for angle of arrival as well as signal parameter measurement. This correlation processing method replaces intermediate frequency (IF) components such as logarithmic amplifiers, phase detectors, envelope detectors, scanning filters and associated oscillators, beam forming networks for monopulse receivers and compressive delay lines, thereby providing substantial cost savings and increased commonality between signal intercept and radar receiver application.

The method employs digital autocorrelation and crosscorrelation to determine these parameters. Autocorrelation allows the measurement of signal frequency by measurement of instantaneous signal phase. Crosscorrelation allows measurement of relative phase between two or more signals in two or more channels by measurement of instantaneous phase and by referencing the instantaneous phase to the autocorrelation function. The autocorrelation function and crosscorrelation function preserve relative amplitude and phase information of the signals in multiple channels. Measurement of relative amplitude and phase allows direction finding calculation for any current class of system that uses amplitude and/or phase to derive angle of arrival. Signal time and frequency measurement at the output of the correlation receiver result in robust characterization of the parameters of the signal. Digital calculations are superior to current analog or hybrid analog and digital methods because errors due to component aging, drift and temperature effect are easily prevented.

DESCRIPTION OF THE PREFERRED EMBODIMENT

The correlation receiver measures the amplitude and phase of a radiated signal incident on an array of antenna elements. The preferred embodiment measures the relative amplitude and phase of an incoming signal between two or more channels in a receiver. The amplitude and/or phase between the signals received by each of the antenna elements determines the angle of arrival of the signal.

Figure 1:
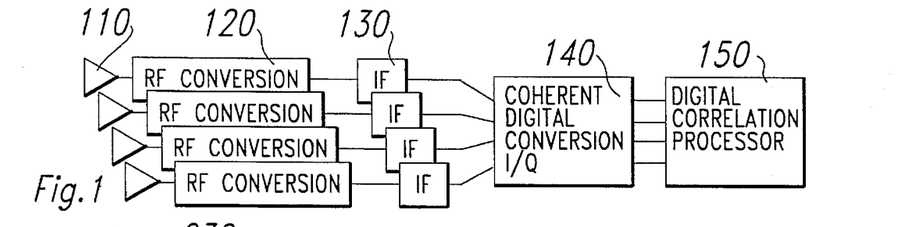
FIG. 1 is a block diagram of a typical prior art multichannel correlation receiver.
Figure 4:
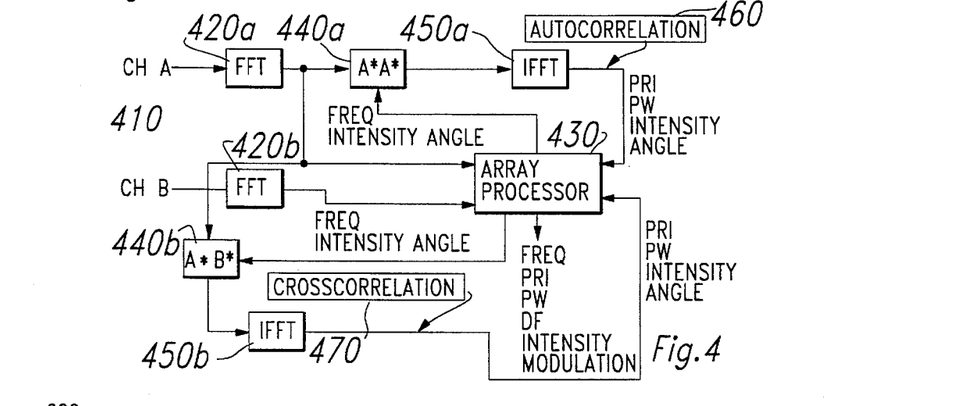
FIG. 4 is a digital correlation processing diagram for a two channel receiver as used in accordance with the present invention.

Referring first to FIG. 1, there is shown a receiver with multiple channels and an array of antenna elements. The amplitude and phase relationships between the output of antenna elements due to the incident angle of the signal are preserved in the receiver. For phase sensing monopulse or interferometry, the outputs of the elements are approximately equal in amplitude with a phase difference that is proportional to the angle of the incident signal off the centerline of the array. In amplitude sensing monopulse, the antenna elements share a common phase center but are steered in slightly different directions. The outputs of the antenna elements differ in amplitude but share the same phase. Each channel of the receiver includes an antenna element 110, an RF conversion stage 120 of standard type which converts the signal received from the antenna from an RF signal to an IF signal, an IF stage 130 of standard type which amplifies and conditions the IF signal received from the RF conversion stage so that it can be digitized and a coherent digital conversion stage 140 for converting the incoming analog signal to a digital signal. Digitization takes place in-phase and in quadrature form so that there are two elements of the signal for each incoming signal received from each channel, one being proportional to the sine of the input signal phase and the other being proportional to the cosine of the phase input signal. It follows that the analog to digital conversion at IF or at baseband generates a vector coherent with the stable phase reference (with coherent in-phase (I) and quadrature (Q) outputs). The receiver components 110 to 140 can be any radar, ECM or modern ESM receiver architecture. The digital correlation processor 150, a preferred embodiment of which is shown in FIG. 4, employs the parameter measurement methods disclosed hereinbelow and operates on the in-phase and quadrature outputs of the outputs of the coherent digital conversion stage.

Figure 2A:
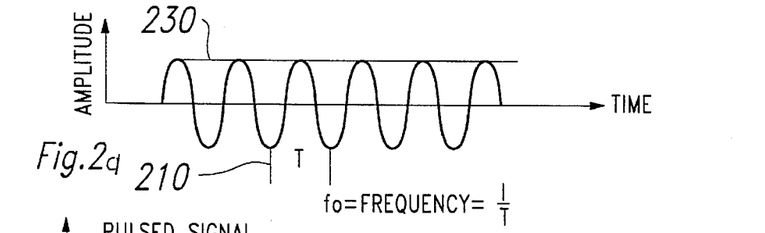
FIGS. 2a and 2b illustrate characteristics of typical continuous wave and pulsed signals respectively, measured at the output of an individual antenna element.
Figure 2B:
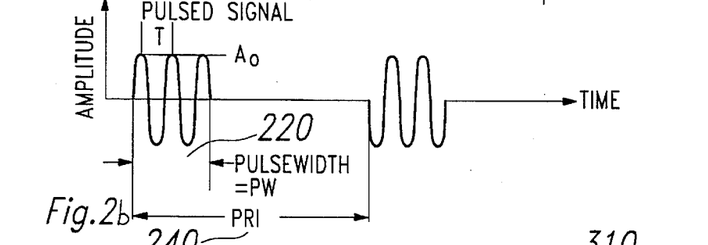

FIGS. 2a and 2b illustrate characteristics of typical continuous wave (CW) and pulsed signals respectively, measured at the output of an individual antenna element 110. The preferred embodiment herein can process continuous wave or pulsed signals with no modulation or various types of amplitude, frequency and/or phase modulation. The time domain signals at this point in the processing chain may be low in amplitude and may be at or below the system thermal noise floor. FIGS. 2a and 2b show the important parameters of the time domain signals such as frequency, pulse width, amplitude and pulse repetition interval.

The time domain sequence from each antenna element is transformed to the frequency domain by techniques such as the Fourier transform. The time domain sequence may be weighted first to reduce spectral leakage in the frequency domain. The frequency domain transform improves the signal-to-noise ratio (and thus detectability) of signals that have bandwidth characteristics narrower than the sample frequency. The frequency domain transform also resolves narrow band signals and allows measurement of their frequency.

Figures 3A, 3B, 6A, 6B:
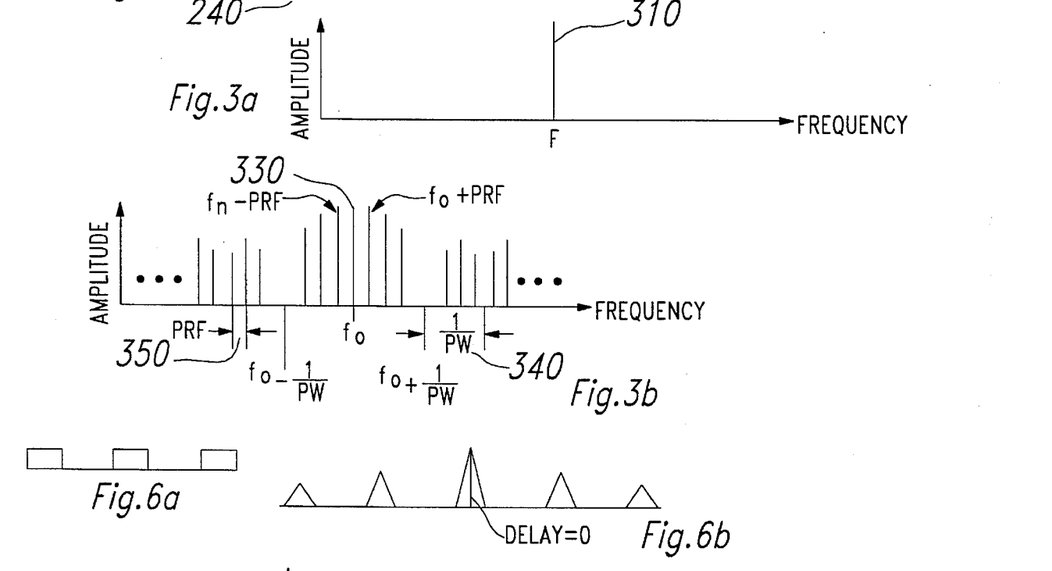
FIGS. 3a to 3c illustrate frequency domain characteristics for a typical continuous wave signal, a coherent pulsed signal and a non-coherent pulsed signal respectively.
FIG. 6a is an examplary plot of a time domain pulse train.
FIG. 6b is an example of a coherent signal correlation domain "compressed" pulse.
Figure 3C:
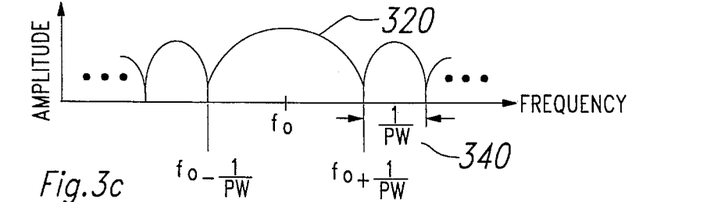

FIGS. 3a to 3c illustrate frequency domain characteristics for a typical continuous wave signal, a coherent pulsed signal and a non-coherent pulsed signal respectively, of interest. The continuous wave wave signal is very narrow band and exhibits the most signal-to-noise improvement. The non-coherent pulse train exhibits a sin(x)/(x) envelope centered at the carrier frequency, $f_0$, with nulls at offsets of multiples of the reciprocal of the pulse width. The coherent pulse train is similar except that energy gathers at lines spaced by the PRF with the centralmost line at the carrier frequency.

Once in the frequency domain, the frequency characteristics of the signals may be measured directly. The angle of arrival is measured by comparing the phase and amplitude of signals from two or more channels as illustrated in FIG. 1. With the signals separated in amplitude, frequency and angle of arrival, individual radiating sources are resolved. The pulse width and the PRI (PRI=1/PRF) for coherent signals may be determined from the frequency domain data as shown in FIGS. 3a to 3c, however this measurement is very susceptible to noise and is not possible at low signal-to-noise ratios. Measurement of pulse width and PRI are more robust when accomplished by the correlation techniques described hereinbelow.

The average SNR improvement in a single filter at the output of the fast Fourier transform (FFT) processor for a coherent signal is: PGFFT (dB)=10★log(N)+20★log(duty), where PGFFT (dB) is average SNR improvement in a single filter in dB, N is the total number of samples processed in the FFT and N★duty is the number of signal samples processed in the FFT. The duty factor manifests itself into the SNR improvement in two ways, resulting in the square term in the equation 20★log(duty). First, since the duty cycle is always less than or equal to one, this term reduces the total amount of signal energy at the output of the FFT (for duty less than one). Second, if the signal does not exist in each time domain sample, its spectral energy at the output of the FFT will split into multiple filters, reducing the peak signal energy in a single filter.

The preferred embodiment of the digital correlation processor as shown in FIG. 4 uses a FFT based correlation calculation to provide estimates of pulse width, PRI, frequency, angle of arrival, intensity and signal modulation for coherent, non-coherent, synchronous or asynchronous signals. A presorting opertion may be performed between the initial Fourier transform and the fast correlation stage in the array processor 430 of the digital processing to remove CW and average value components of the signal. This permits processing of multiple, time-overlapped, pulsed, CW (or simple spread spectrum) chirped, and phase coded signals. Angle of arrival or frequency filtering separates multiple pulsed signals to permit processing of high duty cycle and low duty cycle signals that are highly synchronized in PRI and time of arrival.

Referring to FIG. 4, there is shown a digital correlation processing diagram for a two channel receiver. The two channels, ChA and ChB, (410) each provide complex valued, time domain, sampled and digitized data (variable sample rate determined by the information content of the signal) taken from a different one of the channels shown in FIG. 1, are transformed by hardware (FFTs 420a and 420b) designed to perform a variable and programmable length fast Fourier transform. This results in the transformation of the input time domain data to the frequency domain. The output complex data from FFT 420a is denoted as A and is multiplied in multiplier 440a by the output complex data from FFT 420a which is has been subjected to the complex conjugate operator (which is essentially taking the negative of the imaginary component of the data from FFT 420a) and is denoted as A*. This forms a magnitude at the output of the multiplier 440a. The signal from FFT 420a can also go to an array processor 430. The array processor 430 can select some subset of the signal A and feed that back to the multiplier 440a, this being used as a filter for the output of FFT 420a. Therefore, by selective processing at the array processor 430, which selection can be a region of frequency or an angle of interest, each of the signals is looked at in the array processor, a determination is made as to which signals come from a particular angle of arrival and a selection is made of those signals that come from an area or angle of interest and only those signals can be used as the multiplier in multlipler 440a. The output of the multiplier 440a is then subjected to an inverse fast Fourier transform in IFFT 450a which provides at its output the data in the form of a time series which contains the information to determine pulse repetition interval (PRI), pulse width (PW), intensity and angle. Magnitude and angle are preserved in this signal. This data is fed to the array processor 430 which, in conjunction with other signals input thereto as will be discussed hereinbelow, determines the detected PRI, frequency, PW, direction of arrival (DF), intensity and modulation from the received data.

The output of FFT 420a is also fed to multiplier 440b along with the output of FFT 420b which can be fed to the multiplier 440b directly or through the array processor 430 as shown in FIG. 4. The output complex data from FFT 420a is denoted as A and is multiplied in multiplier 440b by the output complex conjugate of the complex data from FFT 420b which is has been subjected to the complex conjugate operator (which is essentially taking the negative of the imaginary component of the data from FFT 420b) and is denoted as B*. This forms a magnitude at the output of the multiplier 440b. The output of the multiplier 440b is then subjected to an inverse fast Fourier tranform in IFFT 450b which provides at its output the data in the form of a time series which contains the information to determine PRI, PW, relative intensity and relative angle between the two channels. Magnitude and angle are preserved in this signal. This data is fed to the array processor 430 where it is filtered by multiplying it by a selected reference of signal B. This is a crosscorrelation in the same manner as the multiplication in multiplier 440a was an autocorrelation. Since both the angle and intensity of the signal are both present in the inputs to the array processor 430, the array processor contains the mathematics to calculate the direction finding (DF) information or angle of arrival. The mathematics are also present to calculate intensity so that the presence of the signal can be detected. The information in the PRI and PW and angle versus time information are used to calculate the presence of modulation on the signal. Since the angle of the signal is known, the frequency of the input signal can also be calculated.

The correlation processor of FIG. 4 provides both autocorrelation and crosscorrelation measurements to estimate the parameters and direction of arrival of signals. Signal parameters, such as PRI, pulse width, intensity, modulation, frequency and multiple signal presence are estimated with a single channel, using the autocorrelation output and frequency domain information from the first FFT stage. Estimation of direction of arrival requires two or more channels. The autocorrelation and crosscorrelation technique estimates the direction of arrival of multiple signals if the signals have different PRI values. Multi-channel receivers allow covariance estimation using the crosscorrelation calculations and high resolution angle (direction) of arrival measurements using known techniques for angle super resolution.

Further reviewing FIG. 4, which shows the signal processing flow for the processing approach covered by the preferred embodiment of the digital processing, though only two channel are shown and discussed, it should be understood that more than two channels can be present. As stated above, the two channels, ChA and ChB, each having complex valued, time domain, sampled and digitized data (variable sample rate determined by the information content of the signal) taken from a different one of the channels shown in FIG. 1, are transformed by hardware (FFTs 420a and 420b) designed to perform a variable and programmable length fast Fourier transform. This results in the transformation of the input time domain data to the frequency domain. The frequency domain data are separated by angle of arrival by comparing the difference in angle or magnitude and angle between the data in each channel for each frequency in the transformed output in an array processor 430. Signals with angles of arrival that are sufficiently different from each other are entered into separate arrays indexed by frequency. The newly formed arrays are magnitude and cross-product arrays that are formed by multiplying the complex conjugate of each frequency value for one of the channels by its complex amplitude (magnitude) and the complex amplitude of the adjacent channel (cross-product) in a multiplier therefor 440a and 440b. These arrays are transformed using a second stage inverse fast Fourier transform (IFFT) 450a and 450b to provide autocorrelation 460 output functions at the output of one of the IFFTs 450a and 450b and crosscorrelation 470 output functions at the output of the other one of the IFFTs 450a and 450b.

The input signal is sampled such that one or more complex (real and imaginary or in-phase and quadrature) sample is taken for each of two or more pulses or a signal wave form. Estimation of pulse width, PRI, intensity and frequency is achieved at either the autocorrelation 460 or crosscorrelation 470 outputs of the IFFTs 450a and 450b. Angle of arrival is calculated in array processor 430 from the amplitude and/or phase difference between the autocorrelation and the crosscorrelation outputs 460 and 470. Multiple channel receivers use the same processing shown for the two channel example in FIG. 4. Each channel pair is crosscorrelated in multiple channel implementations. Only one autocorrelation channel is required for a receiver with any number of channels.

Figure 5A:
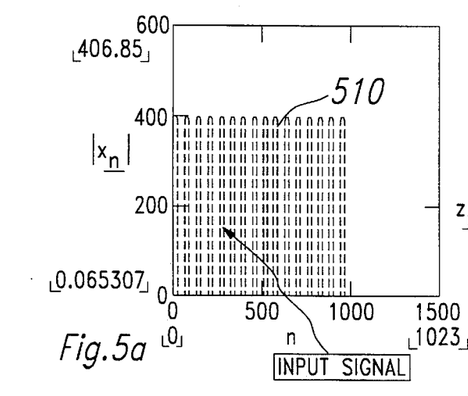
FIGS. 5a to 5d show the methods for PRI, pulse width and intensity measurement for a coherent pulse train.
Figure 5B:
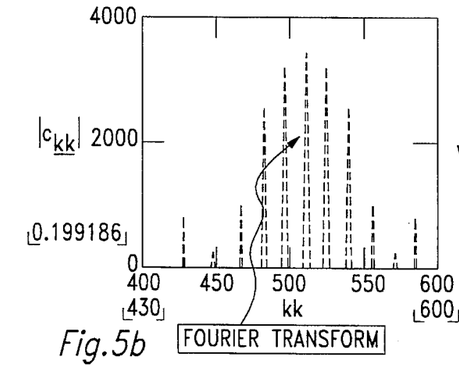
Figure 5C:
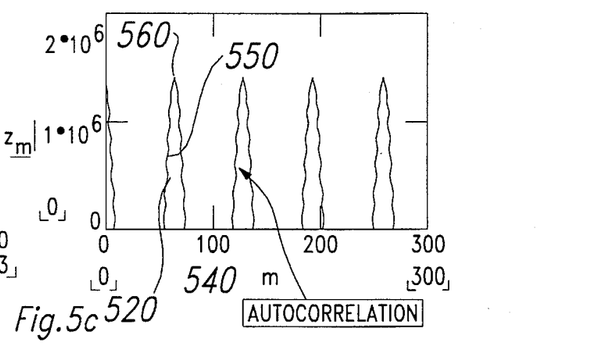
Figure 5D:
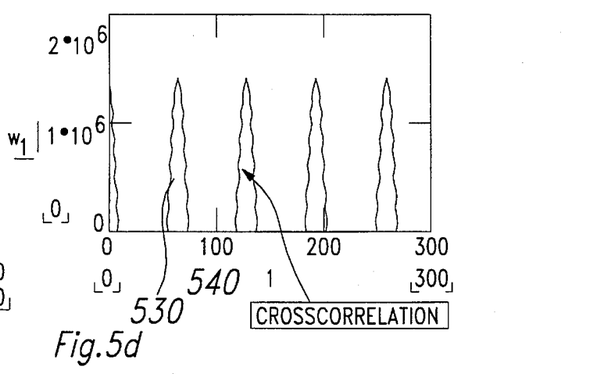

FIGS. 5a to 5d illustrate the procedures required for signal pulse repetition interval (PRI), intensity and pulse width estimation of a single signal with a stable frequency (coherent pulse train) and PRI 510 as shown in FIG. 5a which would be an input signal to one of the channels with its Fourier transform shown in FIG. 5b. The signal PRI is determined by peak detecting the autocorrelation output 520 as shown in FIG. 5c or crosscorrelation output 530 as shown in FIG. 5d. The index of this peak (time or sample number) is related to the PRI of the signal. Multiple peaks will occur at multiples of the the PRI if more than two pulses are within the time window for the input time domain samples. The pulse width is the width of the correlation peak at half the peak amplitude of the correlation peak. Amplitude of the signal is estimated from the amplitude of the correlation peak and the pulse width. Frequency is estimated by computing the phase difference between successive samples of the autocorrelation function for values within the pulse width. The frequency, F, is given by the equation:

$$F=(\phi(\tau_2)-\phi(\tau_1))/\ 2\pi=d\phi/d\tau$$

where $\phi(\tau_i)$ is the phase of the autocorrelation function at delay i. Alternative estimation methods such as averaging or other filtering methods for the parameters above can be developed, but they all depend upon the fundamental relationships defined above.

The capabilities of the correlation receiver to measure frequency, angle of arrival and signal PRI are based upon mathematical properties of the correlation function and the behavior of the discrete correlation function.

Frequency measurement can be explained by considering a single signal in the autocorrelation calculation. If $x(t)=A\cos(\omega t+\phi)$, it can be shown that the autocorrelation function for the input function $x(t)$ is: $R(\tau)=(A^2/2)\cos(\omega\tau)$. The autocorrelation function is independent of $\phi$, but the instantaneous phase of the autocorrelation function is $\omega\tau$ and $d\phi/d\tau=\omega=2\pi f$, where f is the frequency of the signal. Therefore, the frequency is calculated at the output of the autocorrelation function, preferably in the processor 430, by taking the derivative of phase versus time (index) and calculating frequency from the relationship above.

Angle of arrival (AOA) estimation requires two or more channels. Angle of arrival is computed from the phase and/or amplitude difference between the crosscorrelation function and the autocorrelation function at one or more index or time value within the autocorrelation peak. A digital threshold may be applied to determine the number of points for angle calculation. An accurate estimate is obtained from a single index value determined by the peak detector (not shown but which would preferably be included in the array processor 430 of FIG. 4) used to estimate PRI. If more than one sample is used in the estimate, a more robust estimate in the presence of noise at low signal to noise ratios is obtained. For phase sensing systems, angle of arrival (AOA) is given by the equation: $AOA=\sin^{-1}(\lambda x/2\pi d)$, where $\phi$ is the phase difference between the autocorrelation and crosscorrelation in radians, $\lambda$ is the input signal wavelength in meters and d is the distance between the phase centers of the receive antennas in meters. This expression is evaluated at index values (times) which are at the peak or at several values near the peak of the autocorrelation function. It is important to reference the crosscorrelation value to the autocorrelation value since the relative phase, not absolute phase, is related to AOA. This relationship is derived in a manner similar to the derivation of the frequency measurement method previously discussed.

Processing for two channels containing simultaneously measured information from single or multiple sources is considered in the following derivation. When the signal in a first channel is given by the equation $x_1(t)=A_1\cos(\omega_1 t+\phi_1)$ and the signal in a second channel is given by the equation $x_2(t)=A_2\cos(\omega_2 t+\phi_2)$, the autocorrelation function discussed above for the signal in the first channel is arbitrarily chosen for this example as the reference signal as $R_1(\tau)=(A^2/2)\cos(\omega_1\tau)$ where $|\tau|$ is the relative correlation delay. The frequency may be estimated from the time derivative of phase. The crosscorrelation function taken between the two channels is given by: $R_{12}(\tau)=<x_1 x_2>$. It can therefore be shown that $R_{12}(\tau)=0$ when $\omega_1\neq\omega_2$ and $R_{12}(\tau)=\frac{1}{2}A_1 A_2\cos(\omega_1\tau+\phi_2-\phi_1)$ for $\omega_1=\omega_2\neq 0$. When the frequencies of the signals in the two channels are equal, the crosscorrelation function is non-zero and its amplitude is related to the amplitudes of the signals in the two channels. The autocorrelation signal is related to the amplitude of the signal in the reference channel. Since the channel amplitudes are preserved, sum/delta monopulse processing can be accomplished by processing the ratio of the crosscorrelation output to the autocorrelation output. For interferometric processing, phase information is required and is recovered from the phase of the crosscorrelation function referenced to the autocorrelation function phase. The instantaneous phase value of the autocorelation function given above for equal signal frequencies in the two channels is $\omega_1\tau+\phi_2-\phi_1$. The derivative of this phase value with respect to time is $\omega_1$ and the difference between the instantaneous phase of the crosscorrelation function and the autocorrelation function is the relative phase $(\phi_2-\phi_1)$ between the signals in the two channels. If both channels are received by a typical coherent-on-receive system, which incorporates a common stable reference for both channels, both frequency and phase information can be recovered from the measurements. The technique can be extended to multiple channel receiving systems to perform multiple phase center and multiple baseline interferometry.

If more than one signal is present in each of the receiver channels, phase and amplitude information can be recovered by processing multiple peaks of the correlation functions. This is possible if the signals have unique PRI values which are not harmonically related such that the PRI of one signal is not a harmonic of the PRI of another signal in the same receiver instantaneous bandwidth. This processing is possible due to the circular correlation properties of the discrete correlation function realized with the fast Fourier transform (FFT). The discrete correlation function is given by:

$$z(k\Delta t) = \sum_{i=0}^{N=1} x_1(i\Delta t)x_2[(k+i)\Delta t]$$

where $\Delta t$ is the sample interval i is the time index k is the delay index.

If the signals in the two channels are periodic with period PRI, the correlation function above will also be periodic with period PRI. If the two time functions are identical, the function z is the autocorrelation function. If the two time functions are from separate channels, the function z is the crosscorrelation function. The discrete correlation function may be calculated using the FFT by noting that the correlation function is the inverse transform of product of the complex conjugate of the Fourier coefficients of time samples $x_1$ and the Fourier coefficients of time samples $x_2$ by:

$$FFT[z(k\Delta t)] = X_1^*\left(\frac{n}{N\Delta t}\right) X_2\left(\frac{n}{N\Delta t}\right)$$

where $X^*(n/N\Delta t)$ is the complex conjugate of the Fourier transform of time samples $x_1$. The correlation function is given by:

$$z(k\Delta t) = IFFT\left[X_1^*\left(\frac{n}{N\Delta t}\right) X_2\left(\frac{n}{N\Delta t}\right)\right],$$

where IFFT is the inverse fast Fourier transform.

The technique applies to amplitude monopluse, amplitude and phase monopulse and phase interferometry. The processing preserves amplitude and phase information to permit calculation of direction of arrival from relative angle and relative amplitude using the autocorrelation and crosscorrelation methods described above.

If two signals are close to one another in angle and frequency, more than one signal may be in the correlation output since the angle and frequency sorting function may be too coarse to distinguish the two signals. If more than one signal is present in the autocorrelation and crosscorrelation function outputs, multiple peaks will occur at positions related to the PRI values for the individual signals. The terms in the correlation outputs near zero lag will contain information from all signals present in the input time window. To measure the parameters of multiple signals, the PRI values must not be harmonically related (integer multiples). If the signal PRIs are not harmonically related, the parameters of multiple signals can be measures using the peak detection methods described above. Each peak contains information related to the pulse width, PRI, intensity, frequency and AOA of the individual emitters.

A pulse train with a fixed frequency, fixed pulse width and constant PRI, as in pulse Doppler radars, is a coherent, periodic signal. The period of the signal is the PRI. The preferred embodiment disclosed herein provides a robust characterization of such signals if time samples are taken such that each pulse has at least one sample and more than one full PRI is sampled. Correlation can be used to characterize one or more signals which are non-harmonically related. For zero time lag between the signals, the value of the autocorrelation and crosscorrelation functions is related to the average power in the signals and noise present in the receiver. DC offsets and CW signals as well as harmonically related signals are removed by angle gating after the first FFT stage. Any non-harmonically related signals that remain will be characterized by the receiver as described hereinbelow.

As the magnitude of the delay between the signals is increased from zero, the value of the autocorrelation function decreases. When the magnitude of the delay is sufficient to ensure that no signal overlap occurs (i.e., $|\tau|>$ maximum pulse width for all signals present), the value of the autocorrelation function is determined by the noise in the channel or channels. When the magnitude of the delay is increased to a value such that $|\tau|\geq(PRI-pw)_{min}$, where "min" indicates the signal for which the value in parentheses is minimum (PRI and pulse width belong to the same, unique frequency emitter), the correlation function will increase in value until $|\tau|=PRI_{min}$. For larger values of $|\tau|$, the correlation value will decrease to zero at $|\tau'|=(PRI+pw)_{min}$. The correlation function will similarly peak at each successively larger PRI value, as demonstrated hereinabove with reference to FIG. 5, over the region defined by the pulse width for each signal as well as at each integer multiple of each of the PRI values for all the signals present at the IFFT input. If all the signal frequencies are different and the PRI values are unique and non-harmonically related, and the pulse widths are sufficiently small to prevent substantial signal overlap, unique characterizations will exist for each signal in the correlation calculation. If these conditions are not met, further adaptive processing for multiple overlapping signals can be accommodated by filtering the output of the first stage of FFT to separate signals in frequency, space (angle of arrival) or time of arrival dimensions.

If multiple signals can be distinguished in frequency or angle of arrival, separation in the frequency domain before magnitude (or cross product) and correlation calculation (IFFT) provides robust signal characterization, even if the signal PRI values are harmonically related. It is especially important to remove or separate average value (DC frequency component) and CW or very high duty cycle signals from low to moderate duty cycle signals to permit accurate measurement of lower duty cycle signals. This is accomplished by the angle and frequency presorting after the first Fourier transform stage or by appropriate receiver design before analog to digital conversion and is accomplished by known techniques for bandwidth control, such as channelization or bandwidth limitation and by real-time channel blanking for extremely complex, high signal density, environments.

The presence of some types of modulation on the signal can be estimated if sufficient signal to noise ratio exists. Comparisons of time domain measurement of signal frequency and pulse width to the frequency and pulse width at the output of the correlation process can be used to indicate the presence of modulation within the pulse or modulated CW. For a typical radar waveform with PSK or Barker modulation, the width of the modulation "chip" is the value obtained from the correlation process, while an envelope detector will measure the width of the total pulse. For example, if a 13 bit Barker code were used with a 200 nanosecond chip width, the total pulse width measured by an envelope detector would be 13 ★200=2600 nanoseconds. The correlation receiver would indicate an approximately 200 nanosecond pulse width. Comparison of the two results would provide potential information on the type of signal intercepted. Other modulation types, such as FM, BPSK and M-ary PSK provide characterization differences between correlation and time domain receivers that can be exploited to identify the signal type and modulation type for further classification and identification. Additionally, correlating the spectral width and shape at the output of the first FFT stage with the output of the correlation receiver provides further capability to classify signal modulation characteristics using "real time" autonomous systems.

The autocorrelation and crosscorrelation functions permit estimation of time difference of arrival beweeen two physically separated antennas and from two coherent sources, such as may occur in radar glint and signal multipath conditions. Time difference of arrival will result in a difference in the time index for the peaks of the signals in the autocorrelation and the crosscorrelation functions and a phase difference that is proportional to the delay. Multipath signals will experience more delay than direct path signals and will peak at larger time indices than direct path signals. Measurement of time difference of arrival and phase difference permits determination of angle of arrival unambiguously with a small number of antennas and receivers. For signals with spectral content, measurements of the derivative of phase with respect to frequency in the Fourier transform allows measurement of delay if measurement of angle and delay in the correlation output is insufficient to provide unambiguous AOA determination.

The correlation receiver generates the autocorrelation and crosscorrelation functions of the outputs of two separate antennas that view the same signals from different perspectives. As an example, if the antenna received three pulses of a pulse train as shown in FIG. 6a, the sampled time domain envelope of this signal that contains N samples could appear as shown in FIG. 6a. The envelope of the signal in the correlation domain will contain five triangular wave forms which contain 2N samples similar to those shown in FIG. 6b. The correlation domain is much like the output of a pulse compressor. The peak of the signal at t=0 contains all the energy of the pulse train "compressed" to maximize the signal to noise ratio (SNR). The time sidelobes (or PRI peaks) of this "compressed pulse" may have lower amplitude and SNR than the peak at zero delay, but they reveal important information about the signal that is being analyzed.

Figure 6C:
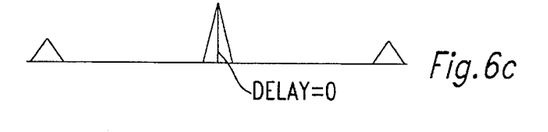
FIG. 6c is an example of a non-coherent correlation domain "compressed" pulse.

In the frequency domain, the pulse train energy is spread over the spectral lines that are characteristic of its Fourier transform. The Fourier transform produces spectral lines (coefficients), the amplitude of which indicates the amount of energy at these frequencies contained in the signal. If the input pulse train consists of a series of coherent phase pulses, as those created by a pulse Doppler radar using a TWT transmitter, the spectrum is well behaved and the signal correlates from pulse to pulse. The spacing between the spectral lines is equal to the pulse repetition frequency. If the phase from pulse to pulse is random, like a pulse train that is generated by a non-coherent radar with a magnetron transmitter, the spectral lines are irregularly spaced. This spectrum is very similar to the spectrum of a phase coded pulse train. The correlation domain "compressed pulse" will appear like the wave form as shown in FIG. 6c. The time sidelobes (correlation peaks) may be suppressed in amplitude.

The Fourier transform exploits periodicity in waveforms. When the waveform is a coherent pulse train, the periodicity is observed in the frequency domain by equally spaced spectral lines. The transform from the frequency domain to the correlation domain employs an inverse Fourier transform. The periodicity of the "wave form" yields a well behaved waveform in the correlation domain (see FIG. 6b). The spectrum that results from the non-coherent phase pulse train will have unequal spacing between its spectral lines and this will result in a waveform in the correlation domain that could have lower energy in the correlation peaks that are at delays greater than zero. However, it is important to observe that for either pulse train, the correlation peak at t=0 contains all the energy associated with the signal analyzed. This has two important implications. First, by reducing the length of time period analyzed the energy around t=0 can be used to analyze the amplitude, frequency and phase of the signal. Second, if multiple signal types are segregated before the transform to the correlation domain, the peak around t=0 will contain only the signal to be analyzed. Angle of arrival can be determined since only the energy from one source is present. Since the peak at t=0 also contains the average power in the wave form for autocorrelation, use of adjacent delay values (delay 1 and delay 2 relative to zero are the second and third samples in the correlation output) is recommended in the preferred embodiment short transform receiver mode.

The present procedure can be applied to a wide variety of wave forms, including coherent, non-coherent, synchronous and asynchronous processing to provide significant improvement in SNR and signal characterization over currently employed techniques. It can be realized in real time applications as well as in post processing applications to permit robust signal characterization and identification. The technique uses programmable sample rates, times and adaptive processing for separation of signals in benign or complex environments. Processing sample rates and time windows are adjusted to the signal environment based upon measured or expected signal characteristics.

For non-coherent signals, high density environments and very low duty cycle signals, the correlation process is used to measure intensity, partial pulse width, angle of arrival and frequency of signals present within a short FFT and correlation time window. The first two samples after the sample at zero delay are used to estimate the partial parameters of the signal. Further processing of the short time transform and correlation data of each successive short aperture time correlation provides approximate measurement of PRI and complete domain signal correlation.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of measuring signal parameters which comprises the steps of:
    (a) providing a first signal and a second signal both in the time domain, said first signal and said second signal each having a real component and an imaginary component;
    (b) converting said first signal and said second signal to the frequency domain;
    (c) autocorrelating a first portion of said converted first signal with a second portion of said converted first signal to provide a measurement of the frequency of said first signal;
    (d) crosscorrelating a first portion of said converted second signal with said first portion of said converted first signal to provide a measurement of relative amplitude and/or phase between said first signal and said second signal; and
    (e) calculating parameters from the results of said autocorrelating and said crosscorrelating.

2. The method of claim 1 wherein said step of calculating parameters includes calculation of said parameters from the combined results of said autocorrelating and crosscorrelating.

3. The method of claim 1 wherein said step of converting comprises the step of providing a Fourier transform of said first signal and said second signal in the time domain.

4. The method of claim 2 wherein said step of converting comprises the step of providing a Fourier transform of said first signal and said second signal in the time domain.

5. The method of claim 1 further including the step of converting the results of said autocorrelation and the results of said crosscorrelation from the frequency domain back to the time domain prior to said step of calculating.

6. The method of claim 2 further including the step of converting the results of said autocorrelation and the results of said crosscorrelation from the frequency domain back to the time domain prior to said step of calculating.

7. The method of claim 3 further including the step of converting the results of said autocorrelation and the results of said crosscorrelation from the frequency domain back to the time domain prior to said step of calculating.

8. The method of claim 4 further including the step of converting the results of said autocorrelation and the results of said crosscorrelation from the frequency domain back to the time domain prior to said step of calculating.

9. The method of claim 1 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

10. The method of claim 2 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

11. The method of claim 3 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

12. The method of claim 4 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

13. The method of claim 5 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

14. The method of claim 6 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

15. The method of claim 7 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

16. The method of claim 8 wherein said step of autocorrelating is provided by measurement of the instantaneous phase of said first signal and said step of crosscorrelating is provided by measurement of the instantaneous phase of said second signal relative to said first signal and by referencing said instantaneous phase to said autocorrelation operation.

17. A system for measuring signal parameters which comprises: (a) means to convert a first signal and a second signal both in the time domain to the frequency domain, said first signal and said second signal each having a real component and an imaginary component; (b) means to autocorrelate a first portion of said converted first signal with a second portion of said converted first signal to provide a measurement of the frequency of said first signal;
(c) means to crosscorrelate a first portion of said converted second signal with said first portion of said converted first signal to provide a measurement of relative amplitude and/or phase between said first signal and said second signal; and
(d) means to calculate parameters from the results of said autocorrelating and said crosscorrelating.

18. The system of claim 17 wherein said means to calculate parameters includes calculation of said parameters from the combined results of said autocorrelating and crosscorrelating.

19. The system of claim 17 wherein said means to convert is a Fourier transform of said first signal and said second signal in the time domain.

20. The system of claim 18 wherein said means to convert is a Fourier transform of said first signal and said second signal in the time domain.

21. The system of claim 17 further including means to convert the results of said means to autocorrelate and the results of said means to crosscorrelate from the frequency domain back to the time domain.

22. The system of claim 18 further including means to convert the results of said means to autocorrelate and the results of said means to crosscorrelate from the frequency domain back to the time domain.

23. The system of claim 19 further including means to convert the results of said means to autocorrelate and the results of said means to crosscorrelate from the frequency domain back to the time domain.

24. The system of claim 20 further including means to convert the results of said means to autocorrelate and the results of said means to crosscorrelate from the frequency domain back to the time domain.

* * * * *